United States Patent [19]

Toyoshima et al.

[11] Patent Number: 5,002,637

[45] Date of Patent: Mar. 26, 1991

[54] COMPOSITE MATERIAL REINFORCED BY PARA-ORIENTED ARAMIDE FIBER SHEET AND PROCESS FOR PREPARING THE SAME

[75] Inventors: Setuo Toyoshima; Shinichiro Kouguchi; Takamasa Ibaraki, all of Tokyo, Japan

[73] Assignee: Honshu Paper Co. Ltd., Japan

[21] Appl. No.: 276,765

[22] Filed: Nov. 28, 1988

[30] Foreign Application Priority Data

Nov. 30, 1987 [JP] Japan .................................. 62-301695

[51] Int. Cl.$^5$ ..................... B32B 27/12; D21H 17/59; D21H 19/32; D21H 19/82
[52] U.S. Cl. .................................. 162/137; 162/157.3; 162/164.4; 174/256; 427/412; 428/361; 428/378; 428/391; 428/395; 428/447; 428/474.4; 428/901; 428/902
[58] Field of Search .............. 428/361, 378, 391, 395, 428/447, 448, 901; 427/412; 162/137, 157.3, 164.4

[56] References Cited

U.S. PATENT DOCUMENTS 4,246,313  1/1981  Steagle ............................... 428/266
4,622,170 11/1986  Wynne et al. ..................... 428/477.7
4,637,851  1/1987  Ueno et al. ......................... 427/40

OTHER PUBLICATIONS

Chem. Abstracts, 101(12):91919.
Chem. Abstracts, 103(4):23228.
Chem. Abstracts, 105(6):44720.
Chem. Abstracts, 105(20):174062.
Chem. Abstracts, 106(4):19885.
Chem. Abstracts, 107(14):116907.
Chem. Abstracts, 110(6):40429.
Chem. Abstracts, 112(22):200390.

Primary Examiner—James C. Cannon
Attorney, Agent, or Firm—Jacobs & Jacobs

[57] ABSTRACT

A composite material comprising a para-oriented aramide fiber sheet and a thermosetting resin matrix. The composite material is characterized in that the reinforcing para-oiented aramide fiber sheet is pre-treated with a reactive siloxane oligomer prior to impregnation with the thermosetting resin. The reactive siloxane oligomer is represented by the following general formula (1) of:

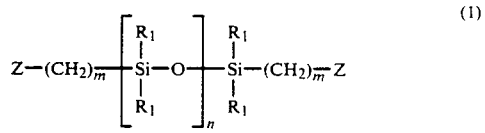

wherein Z is

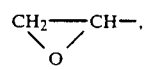

$CH_2$—O—, HS, $NH_2$— or $CH_2$=CH—;

m is an integer of from zero to 4; n is an integer of from 1 to 9; and $R_1$ is the same or different groups selected from methyl, ethyl and phenyl.

The composite material is improved in electric resistance properties, particularly after being dipped in boiling water, and also improved in thermal resistance to soldering.

10 Claims, No Drawings

COMPOSITE MATERIAL REINFORCED BY PARA-ORIENTED ARAMIDE FIBER SHEET AND PROCESS FOR PREPARING THE SAME

BACKGROUND OF THE INVENTION

1. Field of the Invention

The present invention relates to an improved composite material reinforced by a para-oriented aramide fiber sheet, and to a process for preparing the same. More particularly, it relates to a composite material reinforced by a para-oriented aramide fiber sheet to have improved properties well suited for use as a composite material or reinforcing substrate for electrical applications, such as a printed circuit board or an insulating laminate.

2. Prior Art Statement

Para-oriented aramide fibers have improved physical properties, for example, they have excellent resistance to heat, resistance to fatigue and resistance to chemicals, and they have high strength and a high modulus of elasticity. However, since they have poor adhesiveness to thermosetting resins and cannot be intimately bonded to thermosetting resins using conventional technology, their excellent properties are not thoroughly utilized when they are used as substrates for composite materials. In order to overcome this problem, it has been proposed to expose the aramide fibers to plasma (as disclosed, for example, by Unexamined Japanese Patent Publication Nos. 125689/1984 and 171738/1986), to treat them with an aminopolyamide resin (as disclosed by Unexamined Japanese Patent Publication No. 204229/1986), to treat them with a polyurethane compound (as disclosed by Japanese Patent Publication No. 14166/1986) or to treat them with a resorcin/formalin oligomer (as disclosed by Unexamined Japanese Patent Publication No. 121591/1975). Although it is stated that the aramide fibers treated through these prior art techniques have improved adhesiveness, the results are not yet satisfactory.

In particular, a laminate for electrical uses should have high electric resistance even after it has absorbed water. However, a composite material reinforced by para-oriented aramide fibers and having satisfactory electric resistance in such a situation has not yet been known.

It has been known that a laminate can be prepared initially by impregnating a para-oriented aramide fiber sheet with a thermosetting resin, such as an epoxy resin, to form a prepreg which is then stacked and subjected to hot-press molding. The laminate prepared by such a process is low in thermal expansion coefficient and improved in dimensional stability due to the excellent properties of the para-oriented aramide fibers. (Unexamined Japanese Patent Publication No. 60500/1986) However, the para-oriented aramide fibers in the resultant laminate do not adhere sufficiently to the thermosetting resin, which results in unsatisfactory electric resistance after it has absorbed water. Accordingly, the laminate prepared using conventional technology cannot be applied in practical uses.

SUMMARY OF THE INVENTION

It is a primary object of this invention to overcome or solve the aforementioned problems of the known composite materials reinforced by para-oriented aramide fibers.

A more specific object of this invention is to provide a composite material reinforced by para-oriented aramide fibers, which may be applied in electrical uses, for example, in the form of a laminate.

According to the principal feature of this invention, a para-oriented aramide fiber sheet is treated with a reactive siloxane oligomer to cover the surfaces of the para-oriented aramide fibers with a reactive siloxane oligomer film.

More particularly, the present invention provides a composite material reinforced by a para-oriented aramide fiber sheet comprising a para-oriented aramide fiber sheet, a thermosetting resin matrix, and a reactive siloxane oligomer existing at the interface between the para-oriented aramide fibers and the thermosetting resin matrix.

According to another aspect of this invention, a process is provided for preparing a composite material reinforced by a para-oriented aramide fiber sheet comprising the steps of treating a para-oriented aramide fiber sheet with a reactive siloxane oligomer and then adding a thermosetting resin matrix.

The reactive siloxane oligomer used in this invention is represented by the following general formula (1) of:

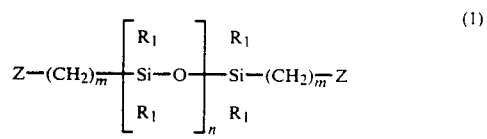

wherein Z is

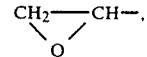

$CH_2$—O—, HS, $NH_2$— or $CH_2$=CH—; m is an integer of from zero to 4; n is an integer of from 1 to 9; and $R_1$ is the same or different groups selected from methyl, ethyl and phenyl.

DESCRIPTION OF THE INVENTION

The para-oriented aramide fiber sheet may be fabricated using conventional technology. Wet and dry paper making processes may be used for the fabrication of the para-oriented aramide fiber sheet.

For instance, in a process similar to the wet process generally adopted for the preparation of a synthetic fiber sheet, para-oriented aramide fibers may be cut into short fibers (having a length of less than 25 mm) to form chopped strands which are dispersed in water singly or together with a pulp prepared by mechanically processing para-oriented aramide fibers. Following sufficient homogenization of the fiber mixture, the dispersed fibers are scooped on to a wire netting to make a paper-like sheet.

The para-oriented aramide fibers are not adhesive by themselves. Accordingly, in the present invention a binder is added to bind the fibers with each other.

Binders which may be used in the present invention include thermosetting resin binders made of, for example, epoxy resins, unsaturated polyester resins, polyimide resins and phenolic resins.

Any to the aforementioned thermosetting resin binders may be used singly or in combination, or may be mixed with a reactive siloxane oligomer, which will be described in detail hereinafter, to form a binder resin mixture. The amount of such a binder ranges generally from about 3 wt % to about 20 wt %, based on the weight of the para-oriented aramide fibers to be used.

In the present invention, para-oriented aramide fibers are used as the reinforcing fibrous material. Typical paraoriented aramide fibers which may be used in this invention include fibers made of poly(paraphenylene terephthalamide) represented by the following chemical formula of:

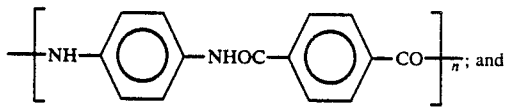

poly(paraphenylene/3,4'-diphenylether terephthalamide) represented by the following chemical formula of:

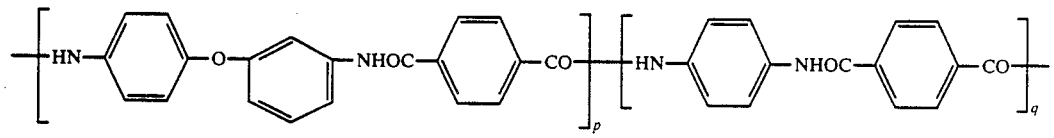

In general, these para-oriented aramide fibers may be used in the form of monofilaments each having a diameter of about 5 to about 20 microns, or in the form of branched fibrils prepared by a microfibril forming process.

One or more of other known synthetic fibers and/or inorganic fibers may be optionally added, as desired.

The dry or wet para-oriented aramide fiber sheet is treated with a solution of a reactive siloxane oligomer dissolved in water or an organic solvent, and then the treated sheet is dried. Any known means including impregnation by dipping or spraying may be adopted for treating the para-oriented aramide fiber sheet with a reactive siloxane oligomer.

The reactive siloxane oligomers used in this invention are those represented by the following general formula (1) of:

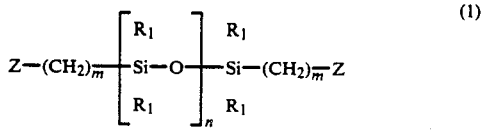

wherein Z is

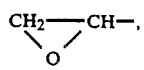

$CH_2-O-$, HS, $NH_2-$ or $CH_2=CH-$;
m is an integer of from zero to 4; n is an integer of from 1 to 9; and $R_1$ is the same or different groups selected from methyl, ethyl and phenyl.

The reactive siloxane oligomer may be added in an amount of not more than about 2 wt %, based on the weight of the para-oriented aramide fibers treated with the thermosetting resin binder.

The sheet material of para-oriented aramide fibers treated with the reactive siloxane oligomer may be directly used as a substrate or reinforcing material for a laminate without any further treatment.

However, the sheet material may be passed through calender rollers maintained at about 120° to 200° C. at a high speed to increase the density of the sheet material to a proper level.

According to the present invention, the sheet material of para-oriented aramide fibers is used as a reinforcing substrate material which is combined with a thermosetting matrix resin to form a composite material.

The composite materials of this invention may be prepared through any of the known processes. However, it is preferred that a resin or resin mixture be impregnated into the sheet material by preparing a so-called "varnish" by dissolving one or more resins in a variety of solvents such as methyethylketone, methyl cellosolve and acetone and then dipping the sheet material in the varnish.

In the conventional technology, various coupling agents, such as silane base (for example, γ-glycidoxy-propyltrimetoxysilane) or titanate base coupling agents, have been used for example, isopropyltri (N-aminoethyl-aminoethyl) titanate for increasing the binding force between the reinforcing substrate material and the matrix resin. However, it is found that these known coupling agents are not very effective in increasing the binding force between para-oriented aramide fiber and a resinous material. Although attempts were made to use, as the coupling agent, polyfunctional epoxy base compounds which are considered to have relatively good binding properties with various matrix resins and also to have high reactivity, the results were not satisfactory.

The reactive siloxane oligomer used in this invention has terminal groups which are included generally in the known coupling agents and the known polyfunctional epoxy compounds. However, contrary to expectation, our investigations have revealed that surprising improvement in adhesiveness between the para-oriented aramide fibers and thermosetting resins is attainable by the use of the reactive siloxane oligomer.

In view of the foregoing, although it is not intended that we be bound by any theory, it should be apparent that the superior effects attainable by this invention are attributable not only to the "terminal groups" of the reactive siloxane oligomer used in this invention, but also to the "main chain portion" having a proper length.

The above and other objects and advantages of the present invention will become apparent from the following Examples.

EXAMPLE 1

Kevlar 49 (Fiber Length: 6 mm) and Kevlar, pulp, both available from E. I. Du Pont de Nemours & Co. Inc., were mixed in a mixing ratio of 3:1 and used as the para-oriented aramide fiber material. The mixture of Kevlar 49 and Kevlar pulp was dispersed in water to prepare a paper making stuff having a fiber concentration of 0.5%. A paper-like sheet having a basis weight of 50 g/m² was made from the dispersion of paper making stuff using a cylinder paper machine. A bisphenol-type epoxy resin emulsion was added by spraying it onto the sheet in an amount of about 10% by solid basis, and then the sheet was passed through a hot air zone maintained at 120° C. to be dried to obtain a continuous sheet.

The sheet was then impregnated with a 2% aqueous solution of a reactive siloxane oligomer represented by the following chemical formula (2), and then dried by hot air at 120° C.

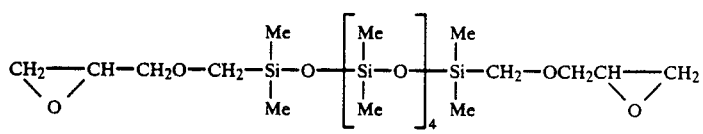
(2)

The sheet treated with the oligomer was calendered, and then subjected to heating treatment at 180° C. for one minute. As a result, a para-oriented aramide fiber sheet having a density of 0.5 g/cm³ was obtained.

The para-oriented aramide fiber sheet was impregnated with an epoxy resin varnish having the composition as set forth below, and dried for 5 minutes in an atmosphere maintained at 150° C. to form a prepreg.

| Composition of Epoxy Resin Varnish | |
| --- | --- |
| Epikote 1001-B-80 | 50 parts |
| (Produced by Shell International Chemicals Corp.) | |
| Methyl Ethyl Ketone | 32 parts |
| Dicyandiamide | 1.6 parts |
| Methyl Cellosolve | 16 parts |
| Benzyldimethylamine | 0.08 parts |

Twenty sheets of the prepreg were stacked, with both the top and bottom faces of the stack covered by a 35 micron thick copper foil for a printed circuit board, and heated under pressure at 180° C. for 2 hours while applying a pressure of 50 kg/cm² in a hot press, whereby a laminate was prepared. The electrical properties of the thus prepared laminate were appraised generally in accordance with the JIS C-6481 method. The results are shown in Table 1. As shown in Table 1, the laminate had satisfactory properties for electrical uses.

EXAMPLE 2

Generally following similar procedures as those described in Example 1, except that a reactive siloxane oligomer represented by the following chemical formula (3) was

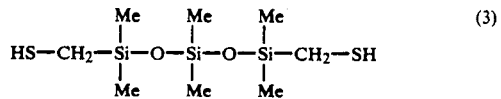
(3)

EXAMPLE 3

A plain weave aramide fiber cloth having a basis weight of 173 g/m² and a thickness of 0.25 mm was used as a para-oriented aramide fiber sheet which wa treated with a reactive siloxane oligomer represented by the following chemical formula (4) in a manner similar to that of Example 1. The treated sheet was then impregnated with the same epoxy resin varnish as used in Example 1 in a manner similar to that described in Example 1 to prepare a prepreg. Six sheets of the prepreg were stacked and then molded under the same conditions as described in Example 1 to prepare a laminate. The electrical properties of the laminate were appraised as in Example 1. The results are shown in Table 1.

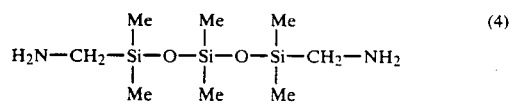
(4)

EXAMPLE 4

Generally following similar procedures as those described in Example 1, except that a reactive siloxane oligomer represented by the following chemical formula (5) was used, a laminate was prepared and appraised. The results are shown in Table 1.

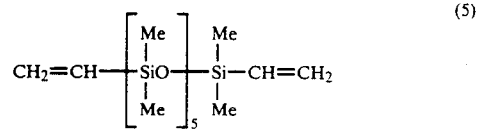
(5)

COMPARATIVE EXAMPLE 1

A similar procedure as in Example 1 was repeated except that the para-oriented aramide fiber sheet was not treated with the reactive siloxane oligomer. The results are shown in Table 1.

COMPARATIVE EXAMPLE 2

A para-oriented aramide fiber sheet having dimensions of 10 cm × 15 cm was placed in a plasma chamber. The air pressure in the plasma chamber was reduced to $10^{-2}$ Torr and a plasma was generated by applying a high frequency electric power of 50 watts at a frequency of 13.5 MHz, and the sheet was treated with the thus generated plasma. The procedure for preparing a laminate and the test method (JIS C-6481; Method for Testing Copper-Clad Laminate for Printed Circuit Board) for the appraisal of the laminate were similar to those described in Example 1. The results are shown in Table 1.

TABLE 1

| | Example 1 | Example 2 | Example 3 | Example 4 | Comparative Example 1 | Comparative Example 2 |
| --- | --- | --- | --- | --- | --- | --- |
| Insulation Resistance (ohms) *1 | | | | | | |
| Under Normal Condition | $1 \times 10^{15}$ | $2 \times 10^{15}$ | $1 \times 10^{15}$ | $1 \times 10^{15}$ | $1 \times 10^{15}$ | $1 \times 10^{15}$ |
| After Being Boiled | $2 \times 10^{13}$ | $2 \times 10^{13}$ | $1 \times 10^{13}$ | $2 \times 10^{13}$ | $1 \times 10^{12}$ | $9 \times 10^{12}$ |
| Surface Resistance | | | | | | |

TABLE 1-continued

|  | Example 1 | Example 2 | Example 3 | Example 4 | Comparative Example 1 | Comparative Example 2 |
|---|---|---|---|---|---|---|
| (ohms) *2 | | | | | | |
| Under Normal Condition | $3 \times 10^{13}$ | $2 \times 10^{13}$ | $2 \times 10^{13}$ | $4 \times 10^{13}$ | $4 \times 10^{12}$ | $1 \times 10^{13}$ |
| After Being Kept in Special Condition *4 | $7 \times 10^{12}$ | $5 \times 10^{12}$ | $4 \times 10^{12}$ | $6 \times 10^{12}$ | $6 \times 10^{12}$ | $3 \times 10^{11}$ |
| Thermal Resistance to Soldering at 260° C. (sec) *3 | above 180 | above 180 | above 180 | above 180 | 80 | 100 |

*1 JIS C-6481
*2 ASTM D1867-64T, page 850
*3 ASTM D1867-641, page 849
*4 Humidity 90%, temperature 35° C., leaving hour 96 hrs.

As will be seen from the results shown in Table 1, the laminates prepared in accordance with the present invention are superior over conventional products in electric resistance properties (particularly after being dipped in boiling water) and also in thermal resistance to soldering.

What is claimed is:

1. A composite material, comprising a para-oriented aramide fiber reinforcement sheet comprising fibers selected from the group consisting of poly(paraphenylene terephthalimide) fibers and poly(paraphenylene/3,4'-diphenylether terephthalimide fibers, a thermosetting resin matrix, and a reactive siloxane oligomer existing at the interface between said para-oriented aramide fibers and said thermosetting resin matrix.

2. the composite material according to claim 1, wherein said para-oriented aramide fiber reinforcement sheet is a non-woven fabric made of a fibrous material mainly composed of fibers selected from the group consisting of poly(paraphenylene terephthalimide) fibers and poly(paraphenylene/3,4'-diphenylether terephthalimide fibers and bound by a thermosetting binder or a mixture of a thermosetting binder and a reactive siloxane oligomer.

3. The composite material according to claim 1, wherein said para-oriented aramide fiber reinforcement sheet is a woven cloth made of a fibrous material mainly composed of fibers selected from the group consisting of poly(paraphenylene terephthalimide) fibers and poly(paraphenylene/3,4'-diphenylether terephthalimide fibers.

4. The composite material according to claim 1, wherein said reactive siloxane oligomer is modified to have at least one terminal group thereof modified with at least one of the epoxy, amino, ethylene or mercapto groups.

5. A process for preparing a composite material reinforced by a para-oriented aramide fiber sheet comprising the steps of treating a sheet comprising fibers selected from the group consisting of poly(paraphenylene terephthalimide) fibers and poly(paraphenylene/3,4'-diphenylether terephthalimide fibers with a reactive siloxane oligomer and then impregnating the a sheet with thermosetting resin matrix.

6. A process according to claim 5, wherein said para-oriented aramide fiber reinforcement sheet is a non-woven fabric made of a fibrous material mainly composed of fibers selected from the group consisting of poly(paraphenylene terephthalimide) fibers and poly(paraphenylene/3,4'-diphenylether terephthalimide fibers and the thermosetting binder is a mixture of a thermosetting binder and a reactive siloxane oligomer.

7. The process according to claim 5, wherein said reactive siloxane oligomer is modified to have at least one terminal group thereof modified with at least one of the epoxy, amino, ethylene or mercapto groups.

8. The process according to claim 5, wherein said reactive siloxane oligomer is represented by the following general formula (1) of:

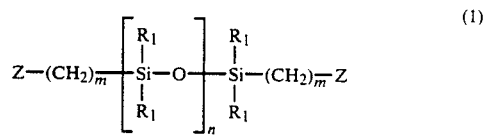

wherein Z is

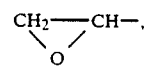

$CH_2$—O—, HS, $NH_2$— or $CH_2$=CH—;
m is an integer of from zero to 4; n is an integer of from 1 to 9; and $R_1$ is the same or different groups selected from methyl, ethyl and phenyl.

9. A process for preparing a composite material reinforced by a para-oriented aramide fiber sheet comprising the steps of treating a fibrous material mainly composed of fibers selected from the group consisting of poly(paraphenylene terephthalimide) fibers and poly(paraphenylene/3,4'-diphenylether terephthalimide fibers with a mixture of a thermosetting binder and a reactive siloxane oligomer, and then applying a thermosetting resin matrix to the treated sheet.

10. The process according to claim 9, wherein said reactive siloxane oligomer is modified to have at least one terminal group thereof modified with at least one of the epoxy, amino, ethylene or mercapto groups.

* * * * *